United States Patent [19]

Vassenaix et al.

[11] Patent Number: 5,004,926

[45] Date of Patent: Apr. 2, 1991

[54] DEVICE FOR THE IRRADIATION OF A PRODUCT ON BOTH FACES

[75] Inventors: Michel Vassenaix, Sceaux; Jacques Milcamps, Clamart, both of France

[73] Assignee: CGR MeV, Buc, France

[21] Appl. No.: 404,631

[22] Filed: Sep. 8, 1989

[30] Foreign Application Priority Data

Sep. 16, 1988 [FR] France ............................ 88 12118

[51] Int. Cl.[5] ........................................ H01J 37/304

[52] U.S. Cl. ............................ 250/492.3; 219/121.29

[58] Field of Search ................ 250/492.3; 219/121.12, 219/121.29

[56] References Cited

U.S. PATENT DOCUMENTS 2,816,231 12/1957 Nygard ......................... 219/121.29
2,824,969 2/1958 Crowley-Milling ............. 250/492.3
3,193,717 7/1965 Nunan ............................. 250/492.3
4,072,356 2/1978 Sanderson ........................ 250/492.3
4,075,496 2/1978 Uehara ............................ 250/492.3
4,201,920 5/1980 Tronc et al. ...................... 250/492.3
4,281,251 7/1981 Thompson et al. .............. 250/492.3
4,492,873 1/1985 Dmitriev .......................... 250/492.3

FOREIGN PATENT DOCUMENTS 1149703 12/1957 France .
2358193 2/1978 France .
2000634 1/1979 United Kingdom .

*Primary Examiner*—Bruce C. Anderson
*Attorney, Agent, or Firm*—Oblon, Spivak, McClelland, Maier & Neustadt

[57] ABSTRACT

A device for the dual-face irradiation of a product is disclosed. The disclosure lies in the fact that a scanning of the electron beam is done during the pulse so as to prevent a scanning along the axis of the scanning chamber and that the divergent scanning beam is deflected by electromagnets so as to obtain a parallel beam. The device can be applied to devices for the ionization of food products.

3 Claims, 2 Drawing Sheets

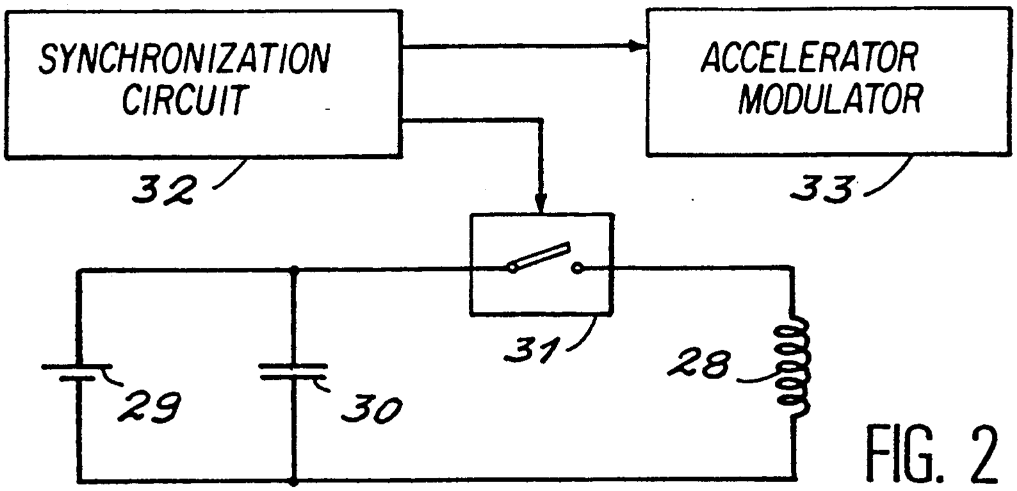
FIG. 2
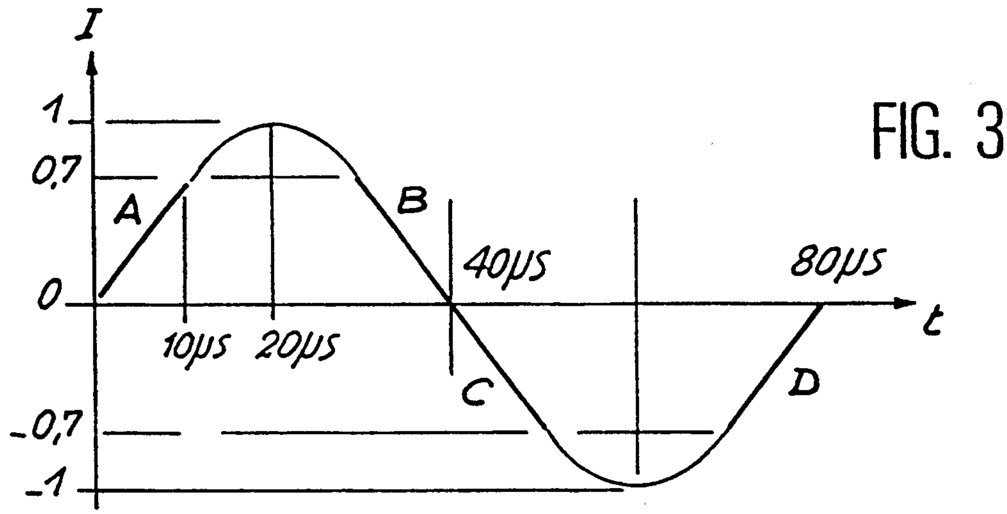
FIG. 3
FIG. 4 a
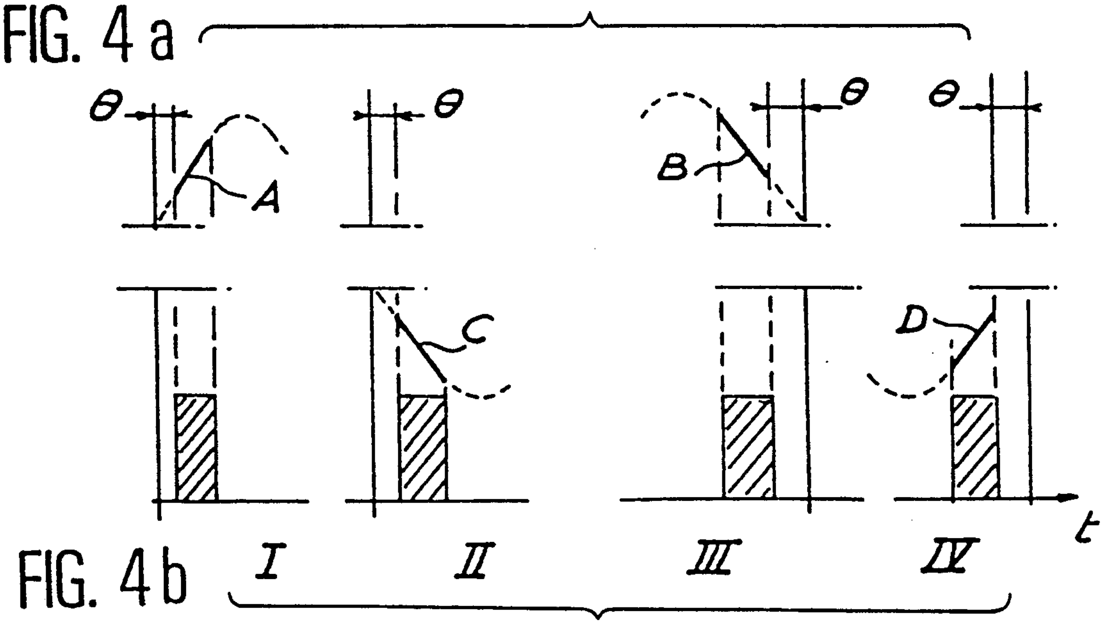
FIG. 4 b

DEVICE FOR THE IRRADIATION OF A PRODUCT ON BOTH FACES

BACKGROUND OF THE INVENTION

1. Field of the Invention

The invention concerns devices enabling the irradiation of both faces of a product by means of an accelerator of charged particles.

2. Description of the Prior Art

A known way to obtain better long-term preservation of food products is to subject them to ionizing radiation. To this effect, the food products are moved in front of a source of radiation, the particles of which strike said food products on one side. A treatment, such as this, of only one face of the products is not enough when these products are in the form of packets of varying thicknesses. A double-sided treatment may be achieved by two successive passages of the packets after they are turned over. This kind of turning over is not possible when the products are loose or in liquid form. Hence, in this case, two radiation sources are used, placed on either side of the device on which the products are flow past, so as to simultaneously irradiate both faces of the products.

For double-sided or dual-face irradiation, there is a description by the applicant, in the French patent application No. 23906392, of a device for the dual-face irradiation of a target with two opposite faces. This irradiation device comprises a charged particle accelerator, for example electrons, associated with a microwave frequency generator so as to give high frequency pulses of charged particles. The beam of charged particles is applied to a horn-shaped scanning chamber where it is subjected, at its entry, to a variable magnetic field, to obtain a deflection of the beam by an angle on either side of the axis of symmetry of the horn. An aperture is made in the wide part of the horn. On one side of the axis of symmetry, this aperture covers half of the aperture of the horn, and is provided with two windows transparent to the beam. The product to be irradiated is moved between these windows. Beyond this aperture, the beam is subjected to a continuous magnetic field which makes the beam turn back by 180° when it scans the other half of the horn with respect to the aperture. By this arrangement, the beam irradiates one of the faces of the product when it scans that part of the horn which includes the aperture, and the other faces when it scans the other part following the return of the beam.

The device described in the above-mentioned patent has the following drawbacks. It occupies a great deal of space heightwise, for the accelerator producing the electrons and the scanning and magnetic deflection devices are superimposed heightwise.

A second drawback is that it does not enable any monitoring of the energy of the flux of the electrons given by the accelerator, and the result thereof is a lack of uniformity of the ionizing treatment.

A third drawback is that the flux of electrons striking the upper face of the product to be ionized is divergent and that, consequently, a major part of the available energy is not used.

A fourth drawback is that the ionizing intensity of the part of the product which is in the vicinity of the axis cannot be monitored.

An aim of the present invention, therefore, is the making of a device for the dual-face irradiation of a product which does not have the above-mentioned drawbacks.

SUMMARY OF THE INVENTION

The invention refers to a device for the dual-faced irradiation of a product, comprising a charged particle accelerator associated with a modulator so as to emit a charged particle beam in pulse form, a horn-shaped, vacuum-sealed scanning chamber, said chamber having, at the widest end, an aperture occupying half of the cone, and provided with two windows transparent to the beam, said aperture being used for the passage of the product to be irradiated, wherein said device comprises:

magnetic scanning means associated with the scanning chamber to cause an angular deflection, on either side of an axis, of the particle beam for the duration of the beam pulse;

first magnetic deflection means associated with the scanning chamber to convert the divergent angular scanning into parallel scanning and, second magnetic deflection means associated with the scanning chamber to obtain a 180° deflection of the parallel scanning beam corresponding to that part of the scanning chamber that does not have the aperture.

BRIEF DESCRIPTION OF THE DRAWINGS

The invention will be better understood from the following description of a particular embodiment, said description being made with reference to the appended drawings, of which:

FIG. 2 is a block diagram of a device to control the current of the magnet which scans the charged particle beam;

FIG. 3 is a current diagram enabling an understanding of the way in which the scanning magnet current is controlled;

FIGS. 4*a* and 4*b* are diagrams showing the synchronization between the scanning signals and the pulses of particles.

DESCRIPTION OF A PREFERRED EMBODIMENT

Figure 1:
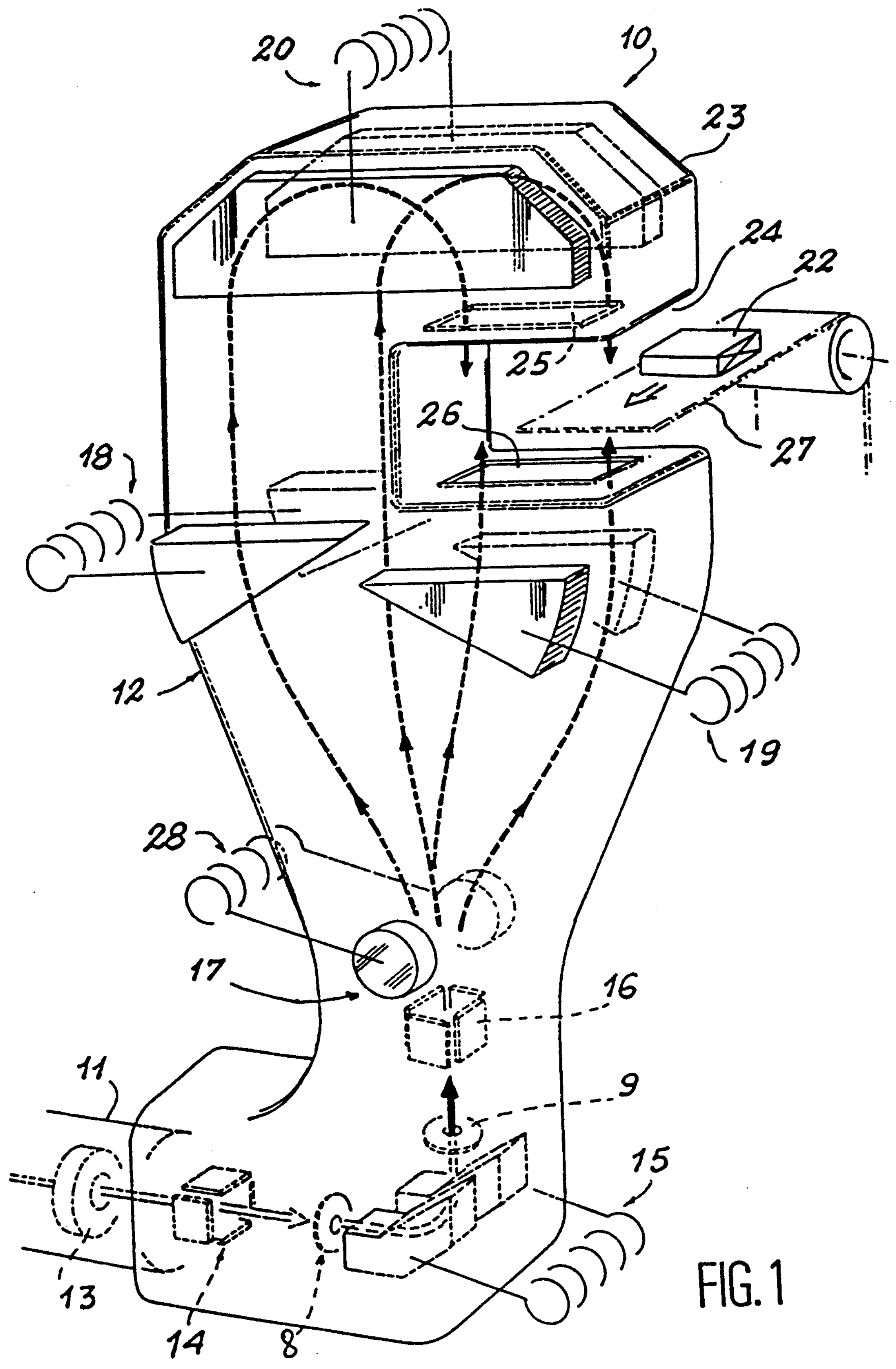
FIG. 1 is a perspective view of the device, according to the invention, for the dual-face irradiation of a product.

Referring to FIG. 1, a device 10, according to the invention, for the dual-face irradiation of a product 22 has a particle accelerator 11 which gives a beam of charged particles, a vacuum-sealed scanning chamber 12 to receive the charged particles beam and a system of magnets 13 to 20 that achieves different angular modifications of said particle beam within the scanning chamber 12.

The particle accelerator is, for example, an electron accelerator that emits pulses of a duration of 10 microseconds and has a power of 10 Mev for example.

The scanning chamber 12 has the general shape of a horn, the narrow part of which forming the entrance of the beam, is placed at the output of the accelerator 11.

The magnet system has a magnetic focusing lens 13, of the Glazer lens type, designed to make the electron beam, that is divergent at the output of the accelerator, convergent. This lens 13 is followed by centering magnets 14 which are used to adjust the direction of the beam of electrons at the entrance to a magnet 15 taking the form of a slot 8. This magnet 15 has two functions, firstly to deflect the direction of the beam to give it a vertical direction and secondly to focus the electron beam in the axial plane in order to obtain a narrower radial beam. At the output of this magnet 15, there is an energy defining slot 9. Only electrons for which the energy corresponds to the magnetic field produced by the magnet 15 can pass through this slot 9. This enables the monitoring of the energy of the electrons.

The electron beam is pointed towards a scanning magnet 17 by means of corrective magnets 16, the latter being used to make a precise adjustment of the direction of the beam towards the entrance to the magnet 17. The scanning magnet 17, with circular pole pieces is used to deflect the direction of the beam by a certain determined angle, for example an angle of about 20° to 25°, for the pulse duration of 10 microseconds. Depending on the scanning direction, the beam is pointed towards a magnet 18 or a magnet 19, each of which has the effect of converting the beam, made divergent by the scanning, into a parallel beam.

Finally, a deflection magnet 20 has the effect of deflecting the parallel beam, leaving the magnet 18, by an angle of 180° so as to obtain its complete return.

The products 22 to be irradiated are moved by means of a conveyer 27 transparent to the electron beam. This conveyor is placed between the magnet 20 and the magnet 19 in a direction parallel to the plane of FIG. 1. Since the movement of the products is in the open, while the different paths of the electron beam are in the vacuum-sealed scanning chamber 12, the latter has a notch 24 made between the magnets 19 and 20, and this notch is used for the passage of the products to be irradiated therein. At the position of this notch 24, the part 23 of the scanning chamber 12 has an upper window 25 and a lower window 26, both of which are transparent to the electron beam while the rest of the scanning chamber is opaque to said beam.

In FIG. 1, the different magnets 13, 14, 15, 16, 17, 18, 19 and 20 have been shown very schematically and only their main opposite pole pieces are shown. Windings have also been added such as 28 in a very schematic form. All these magnets, with the exception of the magnet 17, are supplied with DC current and generate a constant magnetic field between their opposite pole pieces. The values of these currents are adjusted when the settings are made so as to obtain the desired deflections for the electron beam.

Only the coil 28 of the magnet 17 is powered by a current that varies in the course of time so as to obtain the scanning of the electron beam for the duration of the pulse.

FIG. 2 gives a schematic diagram of a circuit for the control of the current in the coil 28. It has a DC supply source 29, a capacitor 30 with a capacitance C in parallel with the source 29, a switch 31 in series with the coil, the latter having an inductance L and a resistance R. The switch 31 is controlled by a synchronizing circuit 32 which also controls a modulator 33 of the accelerator 11. The circuit comprising the capacitor 30 and the coil 28 is a resonant circuit such that the current that flows therein has the form:

$$I_{(t)} = \frac{V_o}{L\omega_o} + e^{-\frac{R}{2L}t} \sin \omega_o t$$

when the switch 31 is closed, the capacitor 10 being previously charged with the voltage $V_o$ of the power source 29.

In this formula, $$\omega_o = \frac{1}{\sqrt{LC}}$$

and R is $<<2\sqrt{L/C}$

The diagram of FIG. 3 represents $I_{(t)}$. It is a sinusoid, the cycle of which has been chosen as being equal to 80 microseconds so as to define four zones A, B, C and D which are substantially linear and have a duration of about 10 microseconds each, the duration of the pulse of the electron beam. It is by choosing one of these zones A, B, C or D that the electron beam is deflected on either side of the vertical axis and from the right leftwards or vice versa. More precisely, since the triggering of the sinusoid of FIG. 3 is defined by the closing of the switch 31, this closing instant determines the instant of subsequent triggering of the pulses of the beam, so that said pulses coincide with the zones A, B, C or D depending on the type of scanning to be chosen.

Furthermore, in order to prevent having a beam on the axis, the pulses of the beam begin with a certain delay $\theta$ after the passage of the sinusoid to null amplitude, or end a certain time $\theta$ before said passage. In other words, the magnetic field is never null in the presence of the electron beam.

The diagrams of FIG. 4*a* and 4*b* show the synchronism between the pulses of the beam (FIG. 4*b*) and the zones A, B, C or D of the sinusoids (FIG. 4*a*).

If it is taken, conventionally, that a positive increasing current deflects the beam from the left towards the right, then the part I of FIG. 4 corresponds to a deflection of the beam of the axis towards the right, namely a scanning of the product 22 by the lower window 26; the part II corresponds to a deflection of the beam of the axis leftwards, namely a scanning of the product 22 by the upper window 25; the part III corresponds to a deflection of the beam from the right towards the axis, namely a scanning of the product 22 by the lower window 26; finally, the part IV corresponds to a deflection of the beam from the left towards the axis, namely a scanning of the product 22 by the upper window 25.

The irradiation device that has just been described has the following advantages.

Firstly, an irradiation of both faces of a product is obtained, thus enabling an increase in the thickness of the product for equal power.

Then, the irradiation is done by a scanning. This makes it possible to ionize a relatively great surface of the product during a single pulse while, and at the same time, to use a narrow beam.

As it is a scanning, the energy of the beam is distributed over a greater surface of the windows and the result thereof is a smaller heating.

Each face of the product is scanned successively in both directions, and the result thereof is greater homogeneity of the dose received by the product in view of the distribution of the intensity of the beam during the pulse. This homogeneity of the dose received is further improved by the combination of the deflection magnet 15 and the energy defining slot 9, thus enabling the elimination of electrons that do not have the energy corresponding to the magnetic field of the magnet 15.

Due to the fact that the beam is always shifted with respect to the axis, a space, without radiation, is available at the center to position the guides of the conveyor 27. Furthermore, this enables control over the intensity of ionization on the interior edge of the product 22.

The invention has been described in its application to the irradiation of a product by an electron flux. However, it can be applied to any system of irradiation using a pulse source of charged particles which can be deflected by a magnetic field.

These charged particles can also be converted into particles of another type, for example, electrons can be converted into photons, using targets in the vicinity of each window 25 and 26, which converts the electron flux into a photon flux for example.

Before irradiating the edges of the product 22 more efficiently, it is possible to modify the magnetic field at the magnets 19 and 20 in the vicinity of the windows 26 and 25 so as to concentrate the beam on the edges of the product.

What is claimed is:

1. A device for the dual-faced irradiation of a product, including a charged particle accelerator associated with a modulator so as to emit a charged particle beam in pulse form, a horn-shaped, vacuum-sealed scanning chamber, said chamber having, at the widest end, an aperture occupying half of the cone, and provided with two windows transparent to the beam, said aperture being used for the passage of the product to be irradiated, said device comprising:

magnetic scanning means associated with the scanning chamber for causing an angular deflection, on either side of an axis, of the particle beam for the duration of the beam pulse;

first magnetic deflection means associated with the scanning chamber for converting the divergent angular scanning into parallel scanning;

second magnetic deflection means associated with the scanning chamber for obtaining a 180° deflection of the parallel scanning beam corresponding to that part of the scanning chamber that does not have the aperture; and means for synchronizing both the deflection of the beam and the occurrence of the beam pulse;

wherein the magnetic scanning means comprises a magnet with circular pole pieces, the winding of which is supplied with a current that is variable in the course of the duration of a pulse.

2. An irradiation device according to claim 1, wherein the synchronizing means comprises an oscillating circuit including a capacitor in parallel with a DC supply source, a switch in series with the winding, said switch and the modulator of the charged particle accelerator being controlled by a synchronization circuit so that the switch is first closed to supply the winding and the modulator is then controlled so that the particle beam appears at a first determined time after the passage of the oscillation across a null amplitude or terminates at a second determined time before said passage.

3. A device for the dual-faced irradiation of a product, including a charged particle accelerator associated with a modulator so as to emit a charged particle beam in pulse form, a horn-shaped, vacuum-sealed scanning chamber, said chamber having, at the widest end, an aperture occupying half of the cone, and provided with two windows transparent to the beam, said aperture being used for the passage of the product to be irradiated, said device comprising:

magnetic scanning means associated with the scanning chamber for causing an angular deflection, on either side of an axis, of the particle beam for the duration of the beam pulse;

first magnetic deflection means associated with the scanning chamber for converting the divergent angular scanning into parallel scanning; and second magnetic deflection means associated with the scanning chamber for obtaining a 180° deflection of the parallel scanning beam corresponding to that part of the scanning chamber that does not have the aperture;

wherein the magnetic scanning means comprises a magnet with circular pole pieces, the winding of which is supplied with a current that is variable in the course of the duration of a pulse; and wherein the winding is a part of an oscillating circuit comprising a capacitor in parallel with a DC supply source, and a switch in series with the winding, said switch and the modulator of the charged particle accelerator being controlled by a synchronization circuit so that the switch is firstly closed to supply the winding and the modulator is then controlled so that the particle beam appears at a first determined time after the passage of the oscillation across a null amplitude of terminates at a second determined time before said passage.

* * * * *